(12) United States Patent
Terhune, IV

(10) Patent No.: US 8,123,543 B1
(45) Date of Patent: Feb. 28, 2012

(54) ELECTRICAL CONNECTOR WITH IMPROVED LOADING MECHANISM

(75) Inventor: Albert Harvey Terhune, IV, Chandler, AZ (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 13/113,091

(22) Filed: May 23, 2011

(51) Int. Cl.
*H01R 13/62* (2006.01)

(52) U.S. Cl. .......................................... 439/331; 439/73

(58) Field of Classification Search .................... 439/73, 439/331

See application file for complete search history.

(56) References Cited

U.S. PATENT DOCUMENTS

| | | | |
|---|---|---|---|
| 6,676,429 B1 * | 1/2004 | McHugh et al. | 439/331 |
| 6,799,978 B2 * | 10/2004 | Ma et al. | 439/73 |
| 6,869,303 B1 * | 3/2005 | Ma | 439/331 |
| 7,909,631 B2 * | 3/2011 | Ma | 439/331 |

* cited by examiner

*Primary Examiner* — Tho D Ta

(74) *Attorney, Agent, or Firm* — Andrew C. Cheng; Wei Te Chung; Ming Chieh Cheng

(57) ABSTRACT

An electrical connector includes a socket with a number of electrical contacts and a loading mechanism surrounding the socket. The loading mechanism includes a stiffener, a load plate, and a latch mounted to opposite ends of the stiffener, respectively. The load plate has a plate portion and a tongue extending downwardly from the plate portion at said opposite end. The load plate and the latch rotate on opposite ends of the stiffener from an open position to a closed position. The latch defines a pair of looped sections snapping a pair of protrusions on the tongue as to lock the load plate on the stiffener at the closed position.

20 Claims, 5 Drawing Sheets

ELECTRICAL CONNECTOR WITH IMPROVED LOADING MECHANISM

BACKGROUND OF THE INVENTION

1. Field of the Invention

The invention relates generally to socket connectors and particularly to a socket connector with an improved loading mechanism.

2. Description of Related Art

Competition and market demands have continued the trends toward faster, higher performance electrical systems, particularly with regard to computer systems. Along with the development of surface mount technology in the design of printed circuit boards, higher density electrical circuits, electronic packages such as chip carrying modules that are to be mounted to a circuit board, and higher density interconnect components have been developed to meet the increasing demand for higher performance electrical systems. Surface mount packaging allows for the connection of electronic packages to contact pads on circuit boards rather than with contacts or pins soldered to plated holes extending through circuit boards. Surface mount technology allows for an increased component density on a circuit board, thereby saving space on the circuit board.

Area array socket connectors have evolved, along with surface mount technology, as one high density interconnect technique for integrated circuits. One application of this technology, for example, is the land grid array (LGA) socket connector that is used with an LGA package. The LGA package is durable and is not easily damaged during the installation or removal process or by handling generally. At least some of the other integrated circuit packages, such as a pin grid array (PGA) package, have a standardized layout, or form factor, for contact leads or pins on the package. The contact leads in such packages are fragile and, unlike the LGA package, can be damaged if not handled properly.

While the LGA package is durable, known LGA sockets can be problematic. In at least some LGA sockets, when the socket is opened, the electrical contacts, sometimes referred to as contact beams, are exposed and the LGA package is loaded directly on top of the contact beams by a loading mechanism. The LGA socket is designed for loading and unloading of the package in a vertical direction, i.e. a direction normal, or perpendicular to the circuit board, and consequently the loading mechanism has a stiffener and a load plate rotatably mounted thereto. A load lever made of metal wire is also provided on the stiffener for latching the load plate at a closed position and has at least a ninety degree range of movement to lock or released the load plate. Movement of the load lever for rotation also needs to occupy the space on the printed circuit board.

An improved electrical connector that overcomes the above-mentioned problems is desired.

BRIEF SUMMARY OF THE INVENTION

An object of the present invention is to provide an electrical connector with improved loading mechanism for cost reduction.

An electrical connector comprises a socket with a plurality of electrical contacts and a loading mechanism surrounding the socket. The loading mechanism comprises a stiffener, a load plate mounted to one end of the stiffener, and a latch mounted to an opposite end of the stiffener. The load plate includes a plate portion, a pair of sidewalls at opposite sides thereof, and a tongue extending downwardly from the plate portion at said opposite end. The load plate rotates on the stiffener from an open position to a closed position. The latch rotates on the stiffener so as to lock or unlock the load plate on the stiffener. A pair of protrusions is provided on opposite sides of the tongue and the latch defines a pair of looped sections snapping the protrusions at the closed position.

An electrical connector comprises a socket with a plurality of electrical contacts and a loading mechanism surrounding the socket. The loading mechanism comprises a stiffener with a flat portion, a load plate mounted to one end of the stiffener, and a latch mounted to an opposite end of the stiffener. The load plate includes a plate portion, a pair of sidewalls at opposite sides thereof, and a tongue extending from the plate portion at said opposite end. The load plate rotates on the stiffener from an open position to a closed position. The latch rotates on the stiffener and engages with the tongue so as to lock or unlock the load plate on the stiffener. The latch includes an upper piece and a lower piece connected with each other and defines a notch on the upper piece to receive the tongue of the load plate.

Other objects, advantages and novel features of the invention will become more apparent from the following detailed description of the present embodiment when taken in conjunction with the accompanying drawings.

DETAILED DESCRIPTION OF THE PREFERRED EMBODYMENT

Figure 1:
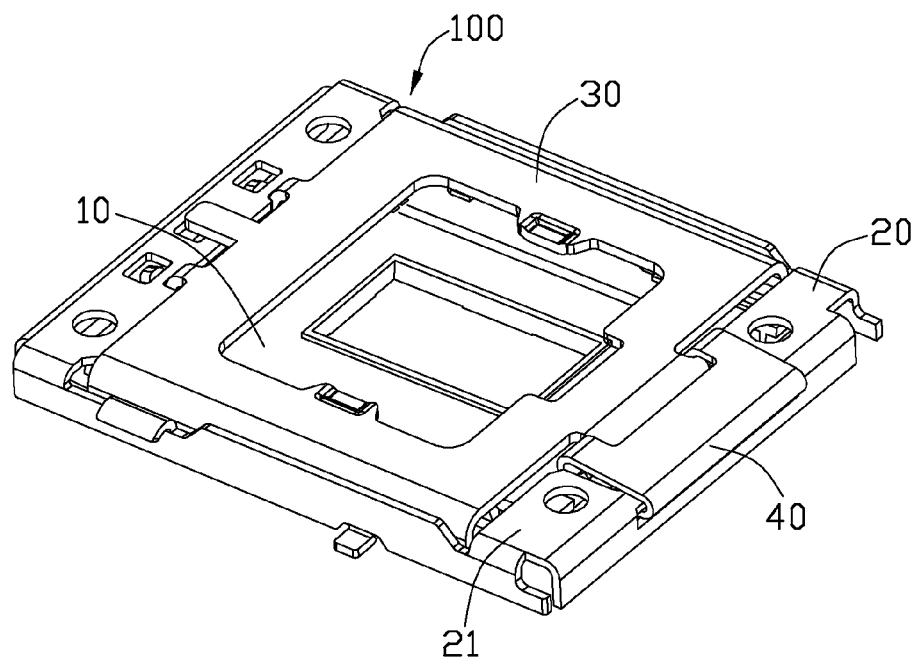
FIG. 1 is an assembled, perspective view of an electrical connector according to a preferred embodiment of the present invention.

Reference will be made to the drawing figures to describe the present invention in detail, wherein depicted elements are not necessarily shown to scale and wherein like of similar elements are designated by same or similar reference numeral through the several views and same or similar terminology.

Figure 2:
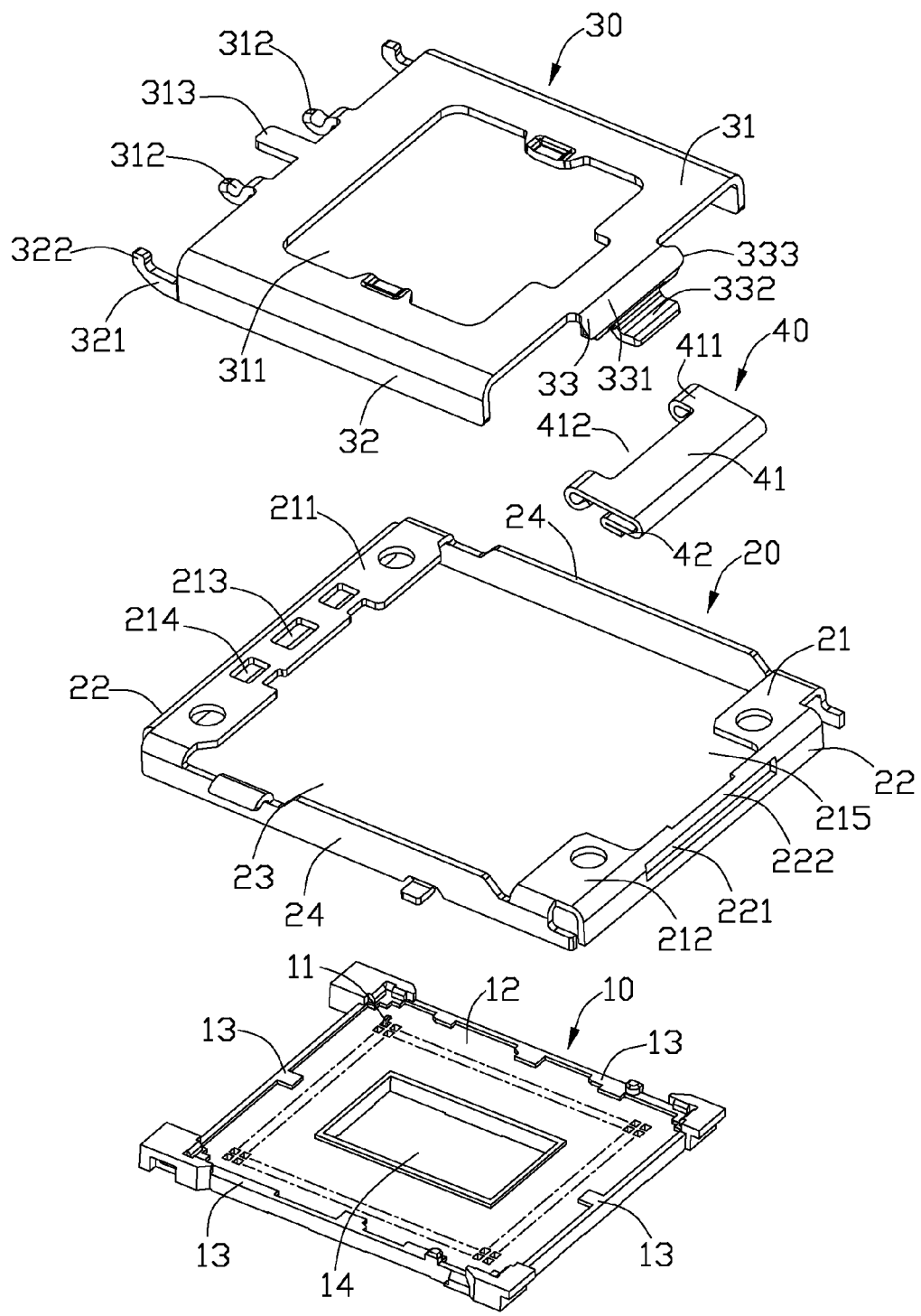
FIG. 2 is an exploded, perspective view of the electrical connector shown in FIG. 1.

FIGS. 1-2 show an example of an electrical connector 100 in accordance with one embodiment of the invention. The electrical connector 100 includes a socket 10 with a plurality of electrical contacts 11 (only one is shown) and a loading mechanism. The socket 10 is surrounded by the loading mechanism and defines a conductive region 12 formed by a plurality of side walls 13 thereof and a central opening 14 penetrating therethrough.

Figure 3:
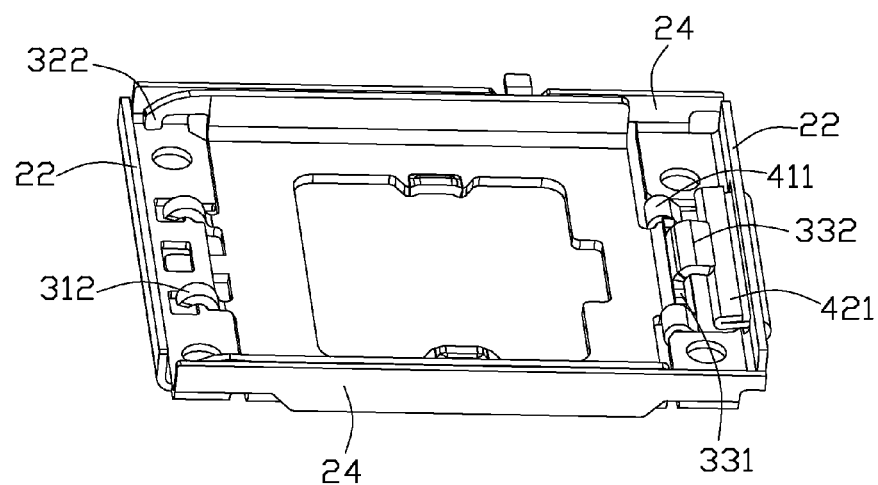
FIG. 3 is a perspective view of the loading mechanism shown in FIG. 1.

Please referring to FIGS. 2-3, the loading mechanism comprises a stiffener 20, a load plate 30 mounted to one end of the stiffener 20, and a latch 40 mounted to an opposite end of the stiffener 20. The stiffener 20 has a flat portion 21 and a pair of first sidewalls 22 bending from opposite ends of the flat portion 21. An opening 23 is defined on the flat portion 21 so as to divide the flat portion 21 into two parts, named a first side plate 211 and a second side plate 222 respectively. The first side plate 211 and the second side plate 212 are connected with each other by a pair of second sidewalls 24 which is perpendicular to the pair of first side walls 22. The first side plate 211 defines a first recess 212 at a middle thereof and a pair of second recesses 213 at opposed sides of the first recess 212. A notch 215 is provided on the second side plate 212 and a slot 221 is provided on the first sidewall 22 corresponding to the notch 215 thereby form a shaft 222 therebetween.

The load plate 30 includes a plate portion 31 with an opening 311 and a pair of side walls 32 perpendicular to the plate portion 31. A pair of hooks 312 extends from one end of the plate portion 31 for coupling to the second recesses 214 of the stiffener 20 so that the load plate 30 rotates on the stiffener 20 between an open position and a closed position. The plate portion 31 includes a tab 313 located between the pair of hooks 312 and received in the first recess 213 during rotation of the load plate 30. A pair of stopper 321 projects from the sidewalls and each has a hook 322 for clasp the first side plate 211 at the open position. A tongue 33 extends from an opposite end of the plate portion 31 and comprises a mating section 331 bent downwardly from the plate portion 31 and an extending section 332 protruding laterally from the mating section 331. The mating section 331 includes a pair of protrusions 333 at opposite sides thereof.

The latch 40 is fabricated of metal material and includes an upper piece 41 and a lower piece 42 parallel to each other. The upper and lower pieces 41, 42 are connected at one end thereof and form a receiving space 43 therebetween. The upper piece 41 is provided with a pair of looped sections 411 protruding relative to the lower piece 42 whereby a notch 412 is formed between the pair of looped sections 411. Each of the looped sections 411 bends downwardly and backwardly and extends towards the upper piece 41 for engaging with the protrusions 333 of the tongue 33. The lower piece 42 further has two folded plates 421.

Figure 4:
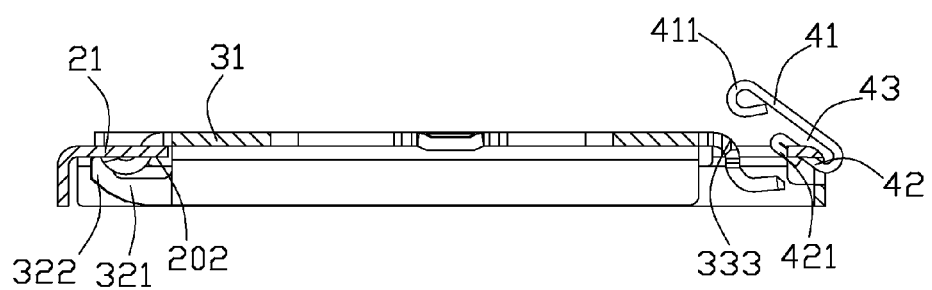
FIG. 4 is a cross-sectional view of the loading mechanism showing the latch is open so that the load plate can rotate to an open position.
Figure 5:
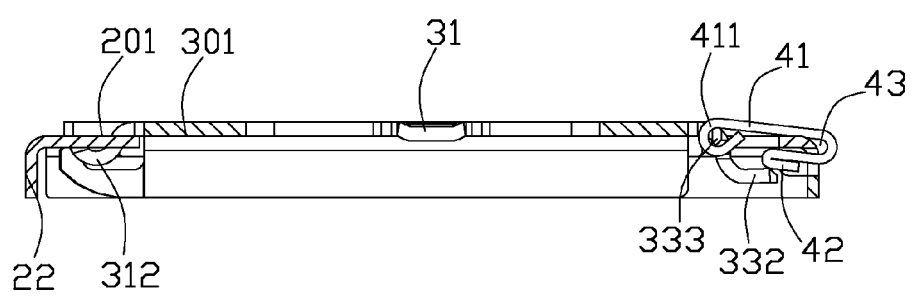
FIG. 5 is similar to FIG. 4 while the latch and the load plate are located at the closed position.

FIGS. 1 and 3 illustrate the perspective, assembly views of the loading mechanism. The shaft 222 is located in the receiving space 43 of the latch 40 and sandwiched by the first and second pieces 41, 42 so that the latch 40 rotates on the stiffener 20 to lock or unlock the load plate 30 on the stiffener 20. FIG. 4 shows the latch 40 is open so that the load plate 30 can rotate to an open position whereby an integrated circuit package (not shown) can be put on the socket 10. The pair of stopper 321 resists a bottom surface 202 of the flat portion 21.

Then, the load plate 30 can rotate to the closed position in a clockwise direction and cover the integrated circuit package. After that, the latch 40 rotates in a counter-clockwise direction thereby the looped sections 411 snap the protrusions 333 of the tongue 33. The mating section 331 is received in the notch 412 and the latch 40 is received in the notch 215. The extending section 332 is pressed by the lower piece 42. A top surface 201 of the flat portion 21 is co-planar with a bottom surface 301 of the plate portion 31 at the closed position as shown in FIG. 4.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An electrical connector, comprising:
a socket with a plurality of electrical contacts; and
a loading mechanism surrounding the socket and comprising a stiffener, a load plate mounted to one end of the stiffener, and a latch mounted to an opposite end of the stiffener, the load plate including a plate portion, a pair of sidewalls at opposite sides thereof, and a tongue extending downwardly from the plate portion at said opposite end and rotating on the stiffener from an open position to a closed position, the latch rotating on the stiffener so as to lock or unlock the load plate on the stiffener; wherein
a pair of protrusions is provided on opposite sides of the tongue, and the latch defines a pair of looped sections snapping the protrusions at the closed position.

2. The electrical connector as claimed in claim 1, wherein the stiffener has a flat portion and a pair of first sidewalls bending downwardly from opposite ends of the flat portion, and an opening is defined on the flat portion which divides the flat portion into a first side plate and a second side plate.

3. The electrical connector as claimed in claim 2, wherein the flat portion has a notch and a slot at said opposite end thereby form a shaft therebetween, and the latch is received in the notch and includes an upper piece and a lower piece parallel to each other, and wherein the upper and lower pieces are connected at one end of the latch and formed a receiving space to receive the shaft.

4. The electrical connector as claimed in claim 3, wherein the pair of looped sections protrudes from the upper piece and forms a notch therebetween, and the tongue comprises a mating section bent downwardly from the plate portion and received in the notch of the latch, and wherein the pair of protrusions are formed on the mating section.

5. The electrical connector as claimed in claim 4, wherein the tongue comprises an extending section protruding laterally from the mating section and pressed by the lower piece.

6. The electrical connector as claimed in claim 2, wherein the flat portion defines a first recess and a pair of second recesses at said one end, and the load plate includes a pair of hooks coupled to the second recesses and a tab received in the first recess.

7. The electrical connector as claimed in claim 2, wherein the first side plate and the second side plate are connected with each other by a pair of second sidewalls perpendicular thereto.

8. The electrical connector as claimed in claim 2, wherein a top surface of the flat portion is co-planar with a bottom surface of the plate portion when the load plate is at the closed position.

9. The electrical connector as claimed in claim 1, wherein a pair of stopper projects from the sidewalls of the plate portion and resists a bottom surface of the flat portion.

10. The electrical connector as claimed in claim 1, wherein the socket defines a conductive region formed by a plurality of side walls thereof.

11. An electrical connector comprising:
a socket with a plurality of electrical contacts; and
a loading mechanism surrounding the socket and comprising a stiffener with a flat portion, a load plate mounted to one end of the stiffener, and a latch mounted to an opposite end of the stiffener, the load plate including a plate portion, a pair of sidewalls at opposite sides thereof, and a tongue extending from the plate portion at said opposite end, the load plate rotating on the stiffener from an open position to a closed position, the latch rotating on the stiffener and engaging with the tongue so as to lock or unlock the load plate on the stiffener; wherein
the latch includes an upper piece and a lower piece connected with each other and defines a notch on the upper piece to receive the tongue of the load plate.

12. The electrical connector as claimed in claim 11, wherein the tongue comprises a mating section bent downwardly from the plate portion and an extending section bent from the mating section, and wherein the upper piece of the latch includes a pair of looped sections snapping the mating section.

13. The electrical connector as claimed in claim 12, wherein the extending section is pressed by the lower piece, and a top surface of the flat portion is co-planar with a bottom surface of the plate portion when the load plate is at the closed position.

14. The electrical connector as claimed in claim 11, wherein the stiffener includes a pair of first sidewalls bending downwardly from opposite ends of the flat portion and defines an opening on the flat portion thereby divides the flat portion into a first side plate and a second side plate, and wherein the first side plate and the second side plate are connected with each other by a pair of second sidewalls perpendicular to flat portion.

15. The electrical connector as claimed in claim 11, wherein the flat portion defines a notch and one of the first side wall defines a slot corresponding to the notch at said opposite end thereby form a shaft therebetween, and the latch is received in the notch and rotatably mounted to the shaft.

16. The electrical connector as claimed in claim 11, wherein the flat portion defines a first recess and a pair of second recesses at said one end, and the load plate includes a pair of hooks coupled to the second recesses and a tab received in the first recess, and the socket defines a conductive region formed by a plurality of side walls thereof.

17. An electrical connector for use with an electronic package, comprising:

an insulative housing defining opposite front and rear ends in a front-to-back direction, and an upward facing receiving cavity between the front ad rear ends;
a plurality of contacts disposed in the housing;
a frame structure located around the housing;
a load plate pivotally, along a first transverse axis, mounted to the frame structure around a rear end of the housing and defining a plate portion for pressing the electronic package, and a tongue extending forward from the plate portion and including a front lower extending section and rear higher mating section having protrusions thereon; and
a latch pivotally, along a second transverse axis parallel to the first transverse axis, mounted to a front end and defining a lower section downwardly pressing the extending section, and an upper section grasping the protrusions.

18. The electrical connector as claimed in claim 17, wherein the protrusions are formed on two lateral sides of the tongue, and the latch defines a pair of looped ends commonly sandwich the mating section in a transverse direction perpendicular to said front-to-back direction and engaged with the protrusions along a third transverse axis parallel to and located between the first transverse axis and the second transverse axis.

19. The electrical connector as claimed in claim 17, wherein the latch is formed by a metal sheet.

20. The electrical connector as claimed in claim 17, wherein the frame structure defines a cutout to receive said latch.

* * * * *